(12) United States Patent
Chen et al.

(10) Patent No.: US 10,553,467 B2
(45) Date of Patent: Feb. 4, 2020

(54) PURGE LOAD PORT

(71) Applicant: Brillian Network & Automation Integrated System Co., Ltd., Miaoli County (TW)

(72) Inventors: Jung-Hua Chen, Baoshan Township, Hsinchu County (TW); Chen-Wei Ku, Baoshan Township, Hsinchu County (TW); Hong-Wen Liao, Baoshan Township, Hsinchu County (TW)

(73) Assignee: Brillian Network & Automation Integrated System Co., Ltd., Miaoli County (TW)

( * ) Notice: Subject to any disclaimer, the term of this patent is extended or adjusted under 35 U.S.C. 154(b) by 217 days.

(21) Appl. No.: 14/945,030

(22) Filed: Nov. 18, 2015

(65) Prior Publication Data
US 2017/0069516 A1 Mar. 9, 2017

(30) Foreign Application Priority Data

Sep. 8, 2015 (TW) .............................. 104129588 A

(51) Int. Cl.
*H01L 21/673* (2006.01)
*B05B 9/01* (2006.01)

(52) U.S. Cl.
CPC .......... *H01L 21/67389* (2013.01); *B05B 9/01* (2013.01)

(58) Field of Classification Search
CPC ................... H01L 21/67389; H01L 21/67775
See application file for complete search history.

(56) References Cited

U.S. PATENT DOCUMENTS

| | | | | |
|---|---|---|---|---|
| 5,697,750 A * | 12/1997 | Fishkin | ............. | H01L 21/67757 414/217.1 |
| 6,393,334 B1 * | 5/2002 | Lewis | ............... | H01L 21/67379 700/117 |
| 6,996,453 B2 | 2/2006 | Ahn et al. | | |
| 8,821,098 B2 | 9/2014 | Natsume et al. | | |
| 8,832,960 B2 | 9/2014 | Kim | | |
| 9,174,253 B2 * | 11/2015 | Natsume | ................. | B08B 9/093 |
| 9,257,320 B2 * | 2/2016 | Fosnight | ........... | H01L 21/67775 |
| 9,508,579 B2 * | 11/2016 | Nakano | ............. | H01L 21/67775 |
| 9,786,531 B2 * | 10/2017 | Sasaki | ............... | H01L 21/67775 |
| 2006/0288664 A1 * | 12/2006 | Okabe | ............... | H01L 21/67393 53/510 |
| 2012/0309286 A1 | 12/2012 | Nakano | | |
| 2016/0147235 A1 * | 5/2016 | Rice | .................. | H01L 21/67775 700/282 |
| 2016/0365266 A1 * | 12/2016 | Murata | ............. | H01L 21/67393 |
| 2017/0025298 A1 * | 1/2017 | Iwamoto | .................. | B08B 5/00 |
| 2017/0069516 A1 * | 3/2017 | Chen | ........................ | B05B 9/01 |
| 2017/0170043 A1 * | 6/2017 | Oh | ........................ | H01L 21/302 |

* cited by examiner

*Primary Examiner* — Kaitlin S Joerger
(74) *Attorney, Agent, or Firm* — Muncy, Geissler, Olds & Lowe, P.C.

(57) ABSTRACT

A purge load port which is a load port devised with a purging plate and a purging module. The purging plate has inlet nozzles, outlet nozzles and recognizer; and the purging module has an inlet opening, an outlet opening, at least a temperature and humidity sensor, at least a flow meter and at least a pressure sensor. It makes the load port incapable of purging to provide the purging techniques after being devised with purging plate and purging modules, which solves the problem of controlling the cleanness by conventional load port, and thus effectively improves the yield of wafers in microchip fabrication.

7 Claims, 5 Drawing Sheets

PURGE LOAD PORT

FIELD OF THE INVENTION

The present invention relates to a load port, particularly to a load port utilized in microchip fabrication. The load port has the function of purging the pod and therefore reduces contamination during fabrication.

BACKGROUND OF THE INVENTION

Wafer surface contamination control becomes a primary task to improve the yield of wafers for the semiconductor and wafer fabs as well as the manufacturers of other high technologies. During fabricating large size semiconductor wafers, the front opening unified pod (FOUP) is used for storing and transporting the wafers, to separate the large size wafers from the exterior air and to prevent contaminations of the large size wafers.

The load port operates in coordination with FOUP and other microchip fabrication equipments. It functions as a device to carry and open the door of FOUP so that the fabricating equipment can receive large size wafers for fabricating. Since the interior of FOUP becomes partially vacuumed when the door of FOUP is closed, once the door of FOUP is opened by the load port, the exterior atmosphere air may flush into the FOUP to contaminate the large size wafers, and thus reduces the fabrication yield.

Therefore, in order to improve the yield of wafer fabrication, the problems of sudden atmosphere air influx caused by opening the door of FOUP have to be resolved to avoid atmosphere air flows into the interior of FOUP. Hence, the load port is further devised to provide a function of purge, which means that the load port itself can supply clean gas to fill in the interior of FOUP, so that the clean gas inside the FOUP flows outward to exterior atmosphere, and thus prevent the current problem of atmosphere air influx. Based on the designs described above, the bottom of FOUP is configured with an inlet nozzle and an outlet nozzle.

However, the conventional load ports are not provided with purge techniques, and are unable to supply clean gas to fill in the interior of FOUP. Therefore, the present invention provides a purge load port which effectively ensures the cleanness inside the FOUP.

Furthermore, since the load ports are universal equipments, it is required to operate in coordination with various types of FOUPs. Different manufacturers may manufacture various FOUPs with variant design and specifications, which leads to variant interface configurations. For example, some FOUPs are formed with a recess or notch around the rear bottom, and particularly the recess or notch is configured between two inlet nozzles; and some FOUPs is devised flatly around the rear bottom. Accordingly, if the load port is used to purge a specific FOUP, the load port has to recognize the specific FOUP before determining whether to purge or not.

SUMMARY OF THE INVENTION

In order to resolve the problem existing in conventional load port incapable of purging, the present invention provides a purge load port, which is a load port devised with a purging plate and a purging module. The load port has a frame erected vertically and the purging module is configured to rack on a side of a lower portion of the frame, and at the top of the lower portion, the load port is formed with a bench board to which the purging plate is mounted; and the frame is set over the bench board to form an accommodating space; wherein the purging plate has an inlet nozzles and an outlet nozzles, both of which are installed on the purging plate, and the inlet nozzle and the outlet nozzle are connected to the purging module.

The purging module has a inflation piping each of which is connected to an corresponding inlet nozzle on the purging plate by one end of the inflation piping, therefore the multiple inlet nozzles are clustered at an inlet opening by means of multiple inflation pipings; a exhaust piping, each of which is connected to a corresponding outlet nozzle on the purging plate by one end of the exhaust pipings, therefore the multiple outlet nozzles are clustered at an outlet opening by means of multiple exhaust pipings; a temperature and humidity sensor which is configured within a distance of 2 meters from the outlet opening; a flow meter which is used to measure the amount of the gas flow flowing through the flow meter; and a pressure sensor which is used to measure the pressure of the gas flowing through the pressure sensor.

In order to resolve the problem existing in conventional load port incapable of purging, the present invention further provides a purge load port, which is a load port devised with a purging plate and a purging module. The load port has a frame erected vertically and the purging module is configured to rack on a side of the frame in a lower portion of the load port, and at the top of the lower portion, the load port is formed with a bench board to which the purging plate is mounted; and the frame is set over the bench board to form an accommodating space; wherein the purging plate has: an inlet nozzles and an outlet nozzles both of which are installed on the purging module, and a recognizer which is configured on the purging plate, and the recognizer can be in an actuating state, wherein the actuation of the actuating state determines the purging module to initiate inflation or exhaust. The load port provided by the present invention is based on the conventional load port and is further devised with the purging plate according to the present invention, so that the load port which is incapable of purging can be advanced to have purging function. Therefore, the utilization rate of the load port is effectively improved. It not only reduces the cost of fabrication, but also improves the yield of wafers in the microchip fabrication.

The load port according to the present invention can be further configured with a purging module, and the load port achieves better cleaning performance by means of the elements of various sensors configured in the purging module.

The load port according to the present invention is further provided with a recognizer module having a switch element, which can further recognize different types of FOUP and accordingly determine whether to initiate the function of purging.

DETAILED DESCRIPTION OF THE INVENTION

Figure 1:
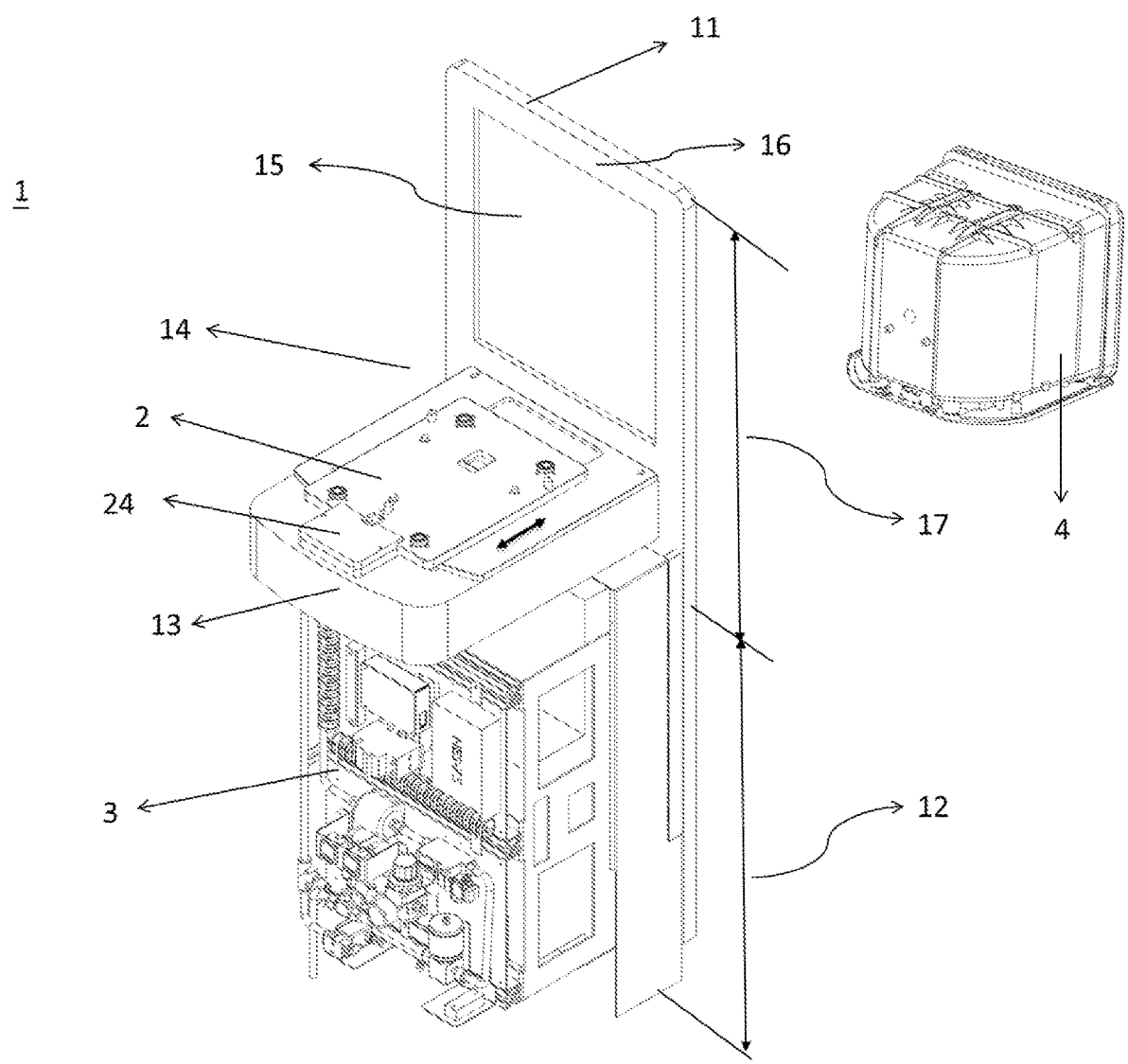
FIG. 1 is a perspective view of the load port according to the present invention.

Firstly, refer to FIG. 1 showing a perspective view of the load port according to the present invention. As shown in FIG. 1, the load port 1 has a frame 11 which is erected vertically. The frame 11 has a first side 16 which is further divided into a lower portion 12 and an upper portion 17 which forms a accommodating space 14 for front opening unified pod (FOUP) 4, wherein another side of the accommodating space 14 in the upper portion 17 is an access opening 15. Furthermore, the lower portion 12 of the load port 1 is devised with a purging module 3. At the top of the lower portion 12, the load port 1 is formed with a bench board 13 over the space accommodating the purging module 3 in the lower portion 12. A moveable purging plate 2 is connected to a driving device 24, and the purging plate 2 together with the driving device 24 are mounted to the bench board 13. When the purging plate 2 contacts with the FOUP 4 and is fixed, the purging plate 2 can be moved locally toward the access opening 15 by the driving device 24 to make the door 44 of the FOUP 4 to contact with the access opening 15, so that the load port 1 can open the door 44 of the FOUP 4; wherein the driving device 24 is configured on one end of the purging plate 2 near the first side 16 of the frame 11.

Figure 2A:
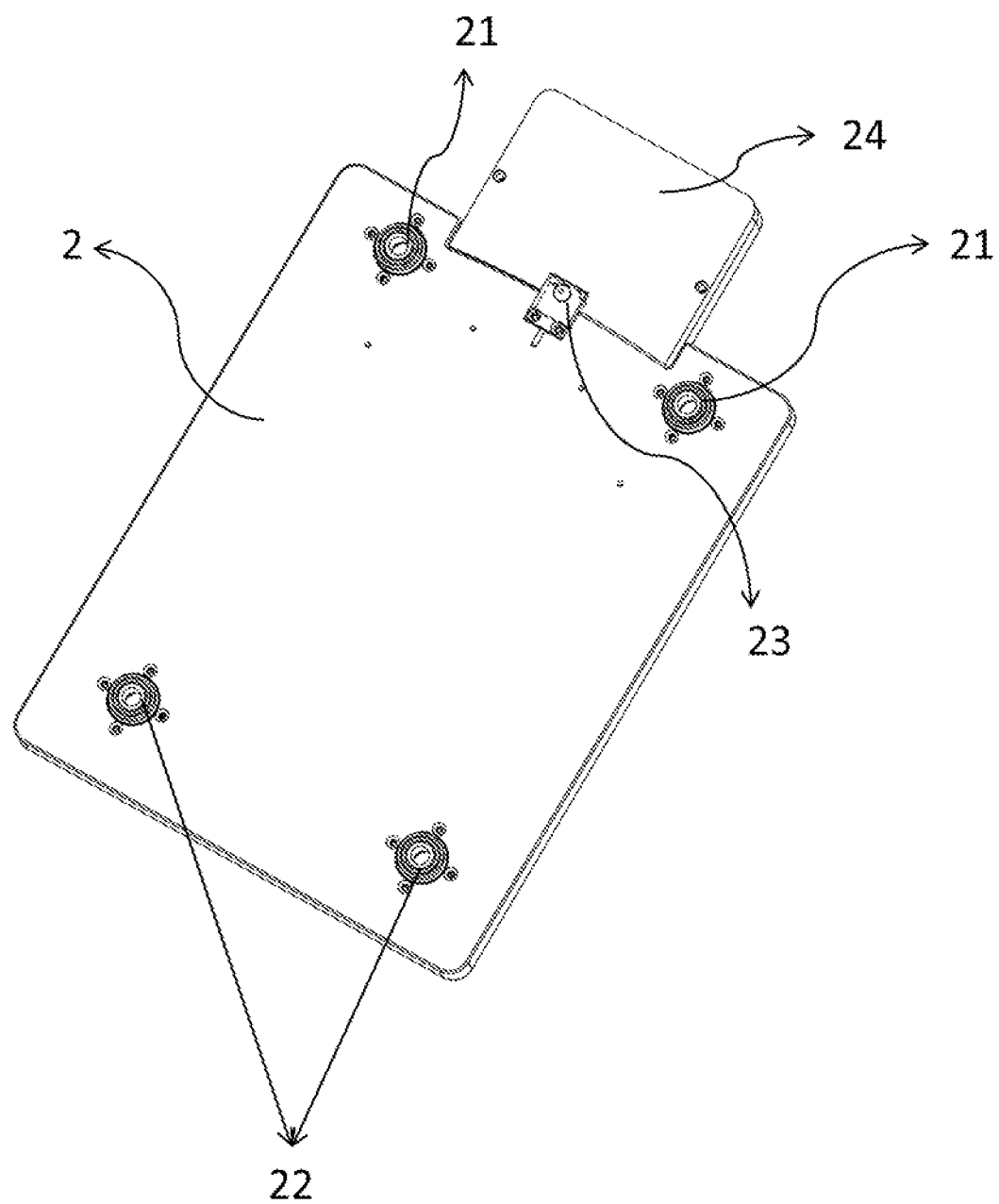
FIG. 2A is a front view of the purging plate of the load port according to the present invention.
Figure 2B:
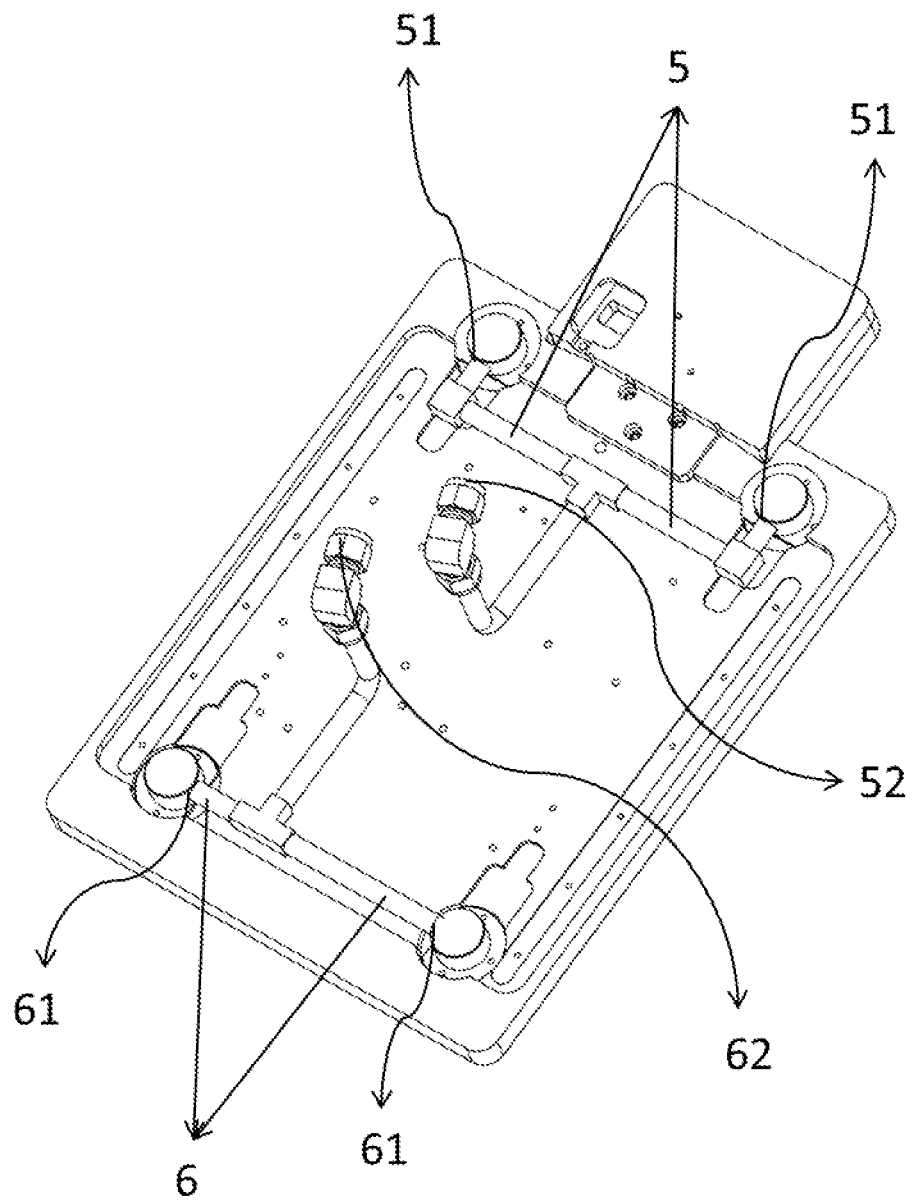
FIG. 2B is a rear view of the purging plate of the load port according to the present invention.

Next, refer to FIGS. 2A and 2B showing a front view and a rear view of the purging plate of the load port according to the present invention. As shown in FIG. 2A, the purging plate 2 includes two inlet nozzles 21 protruding from the purging plate 2 and two outlet nozzles 22 protruding from the purging plate 2; and the inlet nozzles 21 and the outlet nozzles 22 are configured on the periphery of the purging plate 2. As shown in FIG. 2B, Each of the protruding inlet nozzles 21 is connected to the inflation piping 5; and according to an embodiment of the present invention, each of the inlet nozzles 21 is connected to a corresponding first end 51 of the inflation piping 5 respectively. Each of the protruding outlet nozzles 22 is connected to the exhaust piping 6; and according to an embodiment of the present invention, each of the outlet nozzles 22 is connected to a corresponding first end 61 of the exhaust piping 6 respectively. Furthermore, according to a preferred embodiment, the two inlet nozzles 21 are configured on the same side of the purging plate 2. For example, the two inlet nozzles 21 are configured on the same side near the driving device 24, while the two outlet nozzles 22 are configured on the same side, such as the side of the purging plate 2 opposite to the side near the driving device 24. Moreover, a recognizer 23 is further configured on the purging plate 2, which is used to recognize the type of FOUP 4. According to a preferred embodiment, the recognizer 23 is installed on the driving device 24; and the recognizer 23 is a switch element controlled by contact pressure to be switched on or switched off.

Figure 3:
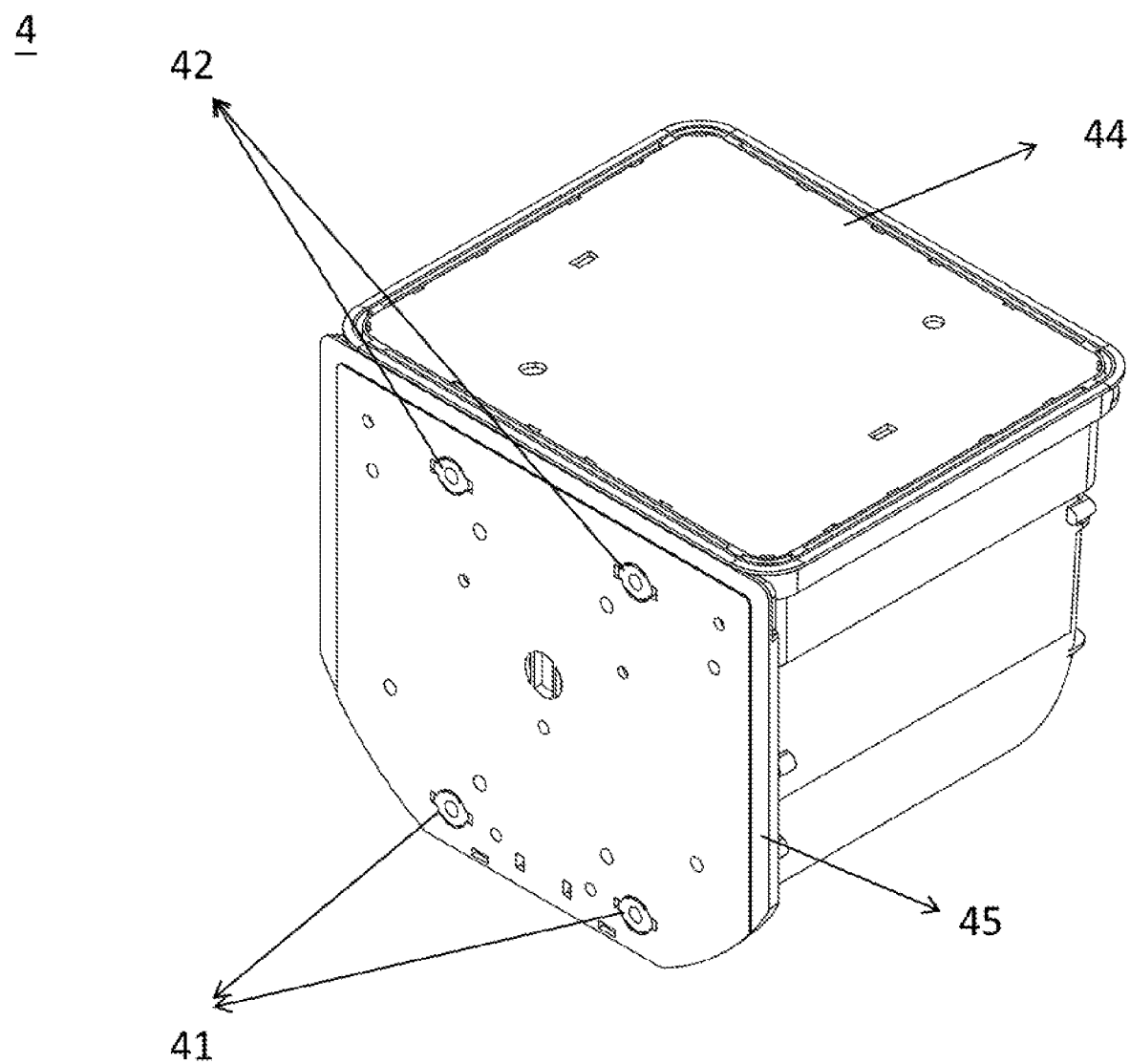
FIG. 3 is a perspective view of a front opening unified pod.

Next, refer to FIG. 3 showing a perspective view of a FOUP. As shown in FIG. 3, when the load port 1 carries the FOUP 4, the FOUP 4 is accommodated in the accommodating space 14 over the purging plate 2. The FOUP 4 includes two inlet valves 41 and two outlet valves 42. Each of the inlet valves 41 is connected to the corresponding inlet nozzle 21; and each of the outlet valves 42 is connected to the corresponding outlet nozzle 22. Furthermore, when the bottom 45 of the FOUP 4 is a flat plane, the bottom 45 should press the recognizer 23 configured on the driving device 24 simultaneously, therefore the recognizer 23 is switched on. In addition, when the bottom 45 of the FOUP 4 is notched to form a recess region, the bottom 45 should not press the recognizer 23 configured on the driving device 24 simultaneously, therefore the recognizer 23 is maintained in the "off" state. According to an embodiment of the present invention, each of the inlet vales 41 of FOUP 4 is connected to the corresponding inlet nozzle 21 as well as each of the outlet valves 42 of FOUP 4 is connected to the corresponding outlet nozzle 22; meanwhile, the recognizer 23 is in the "on" state. Under the circumstances, the load port 1 will initiate the purging function, and operate to fill in the gas into the interior of the FOUP 4 following the flow direction routed by inflation piping 5, each of the inlet nozzles 21, and each of the inlet valves 41, to inflate the FOUP 4; in the meantime, the gas inside the FOUP 4 is exhausted out from the interior of FOUP 4 following the flow direction routed by exhaust piping 6, each of the outlet nozzles 22, and each of the outlet valves 42. However when the recognizer 23 is in the "off" state, the load port 1 will not initiate the purging function.

Figure 4:
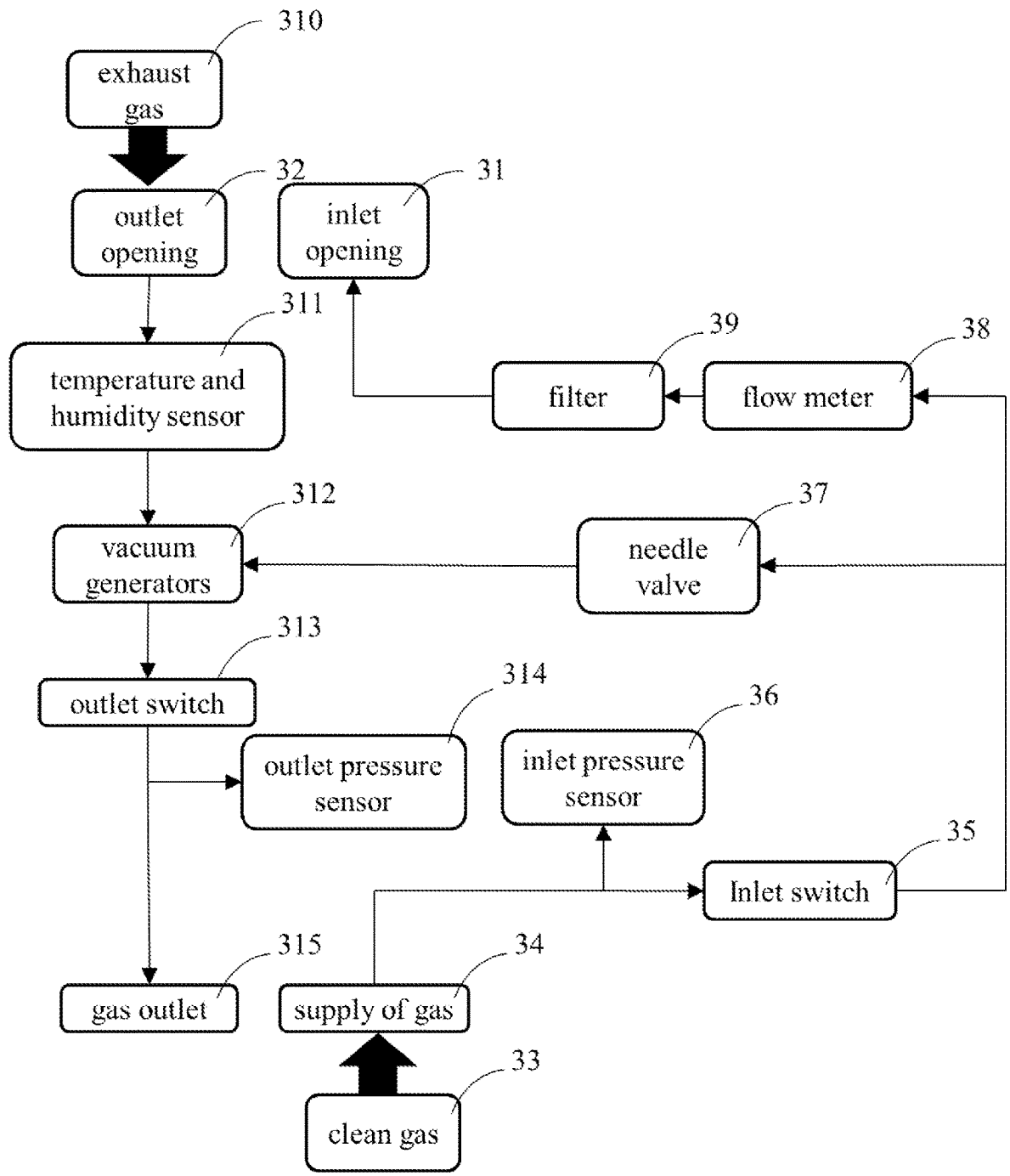
FIG. 4 is a flowchart showing the purging process executed by the load port according to the present invention.

Next, refer to FIGS. 3 and 4. FIG. 4 is a flowchart showing the purging process execute by the load port according to the present invention. First, the clean gas 33 fills in through a supply of gas 34 configured in of the purging module 3. At the same time, a inlet pressure sensor 36 configured in the purging module 3 is used to measure the pressure of the flow-in clean gas 33, and the inflow/outflow of clean gas 33 is controlled by an inlet switch 35. Next, a needle valve 37 is used to regulate the amount of the clean gas 33, and then a flow meter 38 is used to measure the amount of clean gas 33, and a filter 39 is further used to filtrate the clean gas 33. Ultimately, the clean gas 33 arrived at inlet opening 31. At that time, the clean gas 33 is passed from the two inlet nozzles 21 respectively connected to the second end 52 of the inflation piping 5, and then the clean gas 33 is further filled into the interior of FOUP 4 through the inlet valve 41 connected to the two inlet nozzles 21 to perform the cleaning procedure.

After the inflation inside the FOUP 4 through the inlet valve 41 and the FOUP 4 needs to exhaust gas, the exhaust gas 310 is passed from the outlet valve 42, then through the two outlet nozzles 22 connected to the outlet valve 42, and then to a second end 62 of the exhaust piping 6, and the exhaust gas 310 is finally arrived at the outlet opening 32. Next, the temperature and humidity of the exhaust gas 310 is measured by a temperature and humidity sensor 311. In order to detect the status of the exhaust gas 310 accurately, the temperature and humidity sensor 311 needs to be configured within a distance of 2 meters from the outlet opening 31. In this way, the temperature and humidity of the exhaust gas 310 can be monitored and measured within this distance range, allowing the error of the measured values to be controlled and kept within ±3%. Next, the exhaust gas 310 is evacuated by means of a vacuum generator 312. An outlet switch 313 is used to control the inflow/outflow of exhaust gas 310; and an outlet pressure sensor 314 is used to measure the gas pressure of the exhaust gas 310. Ultimately, the exhaust gas 310 is arrived at gas outlet 315 and then exhausted. According to the present invention, by means of the flow meter 38, the inlet pressure sensor 36, the temperature and humidity sensor 311, and the outlet pressure sensor 314 configured in the purging module 3, the cleanness inside the FOUP 4 is exactly controlled.

Apparently, the purging module 3 according to the present invention needs to utilize processor device to monitor the cleanness inside the FOUP 4. For example, a computer (not shown in the drawings) is chosen for monitoring the purging module 3 or the monitoring the measured values provided by purging module 3. When any measured value is out of the predetermined standard range, the computer will alarm, e.g., computer communication system warning message, buzzer phone or warning light, to exactly control the cleanness inside the FOUP 4.

According to the load port 1 according to the description above, once the conventional load port without the purging function is devised with the purging plate 2 and purging module 3, the load port will be given the function of purging. In this way, it will reduce the contamination inside the FOUP 4 so that to minimize the failure rate of wafers. Furthermore, by devising the recognizer module, the load port can recognize different types of FOUP, and then determine whether to execute the purging function or not. In view of the above description, the load port 1 according to the present invention can not only reduce the cost of fabrication equipments but also improve the yield of wafers of the microchip fabrication, leading to contributions for the related industry.

What is claimed is:

1. A purge load port includes an accommodating space for accommodating a front opening unified pod (FOUP) and the load port is devised with at least one purging plate and at least one purging module, the load port having a frame erected vertically, the purging module being configured to rack on a side of a lower portion of the frame, and at the top of the lower portion, the load port being formed with a bench board to which the purging plate is mounted; and the frame being set over the bench board to form the accommodating space, wherein the purging plate comprises:
    at least one inlet nozzle and at least one outlet nozzle both of which are installed on the purging plate, and the inlet nozzle and the outlet nozzle are connected to the purging module;
    a driving device which is connected to the purging plate and is configured on the bench board; and
    a recognizer which is configured on the purging plate and installed on the driving device, the recognizer is a switch element controlled by contact pressure to be switched on or off, wherein the recognizer is provided for determining the purging module to initiate inflation or exhaust, when the bottom of the FOUP is a flat plane, the bottom presses the recognizer configured on the driving device, therefore the recognizer is switched, and the recognizer is maintained in the "on" state, the purging plate is moved locally toward the access opening by the driving device; when the bottom of the FOUP is notched to form a recess region, the bottom does not press the recognizer configured on the driving device, and the recognizer is maintained in the "off" state, the purging plate does not move locally toward the access opening by the driving device, wherein the actuation of the actuating state determines the purging module to initiate inflation or exhaust of the FOUP.

2. The purge load port according to claim 1, wherein the actuating state is arrived once the bottom of the front opening unified pod contacts with the recognizer.

3. A purge load port includes an accommodating space for accommodating a front opening unified pod (FOUP) and the load port is devised with at least one purging plate and at least one purging module, the purging plate having at least one inlet nozzle, at least one outlet nozzle and a recognizer configured on the purging plate, the load port having a frame erected vertically, the purging module being configured to rack on a side of a lower portion of the frame, and at the top of the lower portion, the load port being formed with a bench board to which the purging plate is mounted; and the frame being set over the bench board to form the accommodating space, wherein the purging module comprises:
    at least one inflation piping each of which is connected to the corresponding inlet nozzle on the purging plate by one end of the inflation piping, therefore the multiple inlet nozzles are clustered at an inlet opening by means of multiple inflation pipings;
    at least one exhaust piping, each of which is connected to the corresponding outlet nozzle on the purging plate by one end of the exhaust pipings, therefore the multiple outlet nozzles are clustered at an outlet opening by means of multiple exhaust pipings;
    at least one temperature and humidity sensor which is configured within a distance of 2 meters from the outlet opening;
    at least one flow meter which is used to measure the amount of the gas flow flowing through the flow meter; and
    at least one pressure sensor which is used to measure the pressure of the gas flowing through the pressure sensor;
    wherein the recognizer is configured on the purging plate and installed on a driving device, and the recognizer is a switch element controlled by contact pressure to be switched on or off, wherein the recognizer is provided for determining the purging module to initiate inflation or exhaust, when the bottom of the FOUP is a flat plane, the bottom presses the recognizer configured on the driving device, therefore the recognizer is switched, and the recognizer is maintained in the "on" state, the purging plate is moved locally toward the access opening by the driving device; when the bottom of the FOUP is notched to form a recess region, the bottom does not press the recognizer configured on the driving device, and the recognizer is maintained in the "off" state, the purging plate does not move locally toward the access opening by the driving device, and the actuation of the actuating state determines the purging module to initiate inflation or exhaust of the FOUP.

4. The purge load port according to claim 3, wherein the recognizer is in an actuating state after the bottom of the front opening unified pod contacts with the recognizer.

5. The purge load port according to claim 3, further comprising a computer, wherein the computer is connected to at least one purge load port, and the computer controls the load port and monitor the measured values from the purging module respectively, and the computer alarms when any measured value is out of the predetermined standard range.

6. The purge load port according to claim 3, wherein the purging module comprises a vacuum generator which is used to evacuate an exhaust gas.

7. The purge load port according to claim 3, wherein the purging module comprises a needle valve which is used to regulating the amount of a clean gas flow.

* * * * *